(12) United States Patent
Hartig et al.

(10) Patent No.: US 7,632,571 B2
(45) Date of Patent: *Dec. 15, 2009

(54) HAZE-RESISTANT LOW-EMISSIVITY COATINGS

(75) Inventors: Klaus Hartig, Avoca, WI (US); Annette J. Krisko, Sauk City, WI (US)

(73) Assignee: Cardinal CG Company, Eden Prairie, MN (US)

( * ) Notice: Subject to any disclaimer, the term of this patent is extended or adjusted under 35 U.S.C. 154(b) by 215 days.

This patent is subject to a terminal disclaimer.

(21) Appl. No.: 11/394,992

(22) Filed: Mar. 30, 2006

(65) Prior Publication Data

US 2007/0237980 A1    Oct. 11, 2007

Related U.S. Application Data

(60) Provisional application No. 60/666,799, filed on Mar. 31, 2005.

(51) Int. Cl.
B32B 15/04 (2006.01)
(52) U.S. Cl. .................... 428/432; 428/701; 428/702
(58) Field of Classification Search ............. 427/165, 427/419.2; 428/432, 828.1, 697, 698, 699, 428/701, 702, 704
See application file for complete search history.

(56) References Cited

U.S. PATENT DOCUMENTS

| | | | |
|---|---|---|---|
| 4,166,018 A | 8/1979 | Chapin | 204/192 |
| 4,610,771 A | 9/1986 | Gillery | 204/192.1 |
| 4,619,729 A | 10/1986 | Johncock | 430/128 |
| 4,716,086 A | 12/1987 | Gillery | 428/630 |
| 4,737,379 A | 4/1988 | Hudgens | 427/575 |
| 4,786,563 A | 11/1988 | Gillery | 428/630 |
| 4,859,532 A | 8/1989 | Oyama | 428/336 |
| 4,898,789 A | 2/1990 | Finley | 428/623 |
| 4,900,634 A | 2/1990 | Terneu | |
| 4,965,121 A | 10/1990 | Young | 359/360 |
| 4,996,105 A | 2/1991 | Oyama | 428/336 |
| 5,110,662 A | 5/1992 | Depauw | 428/192 |
| 5,153,054 A | 10/1992 | Depauw | 428/216 |
| 5,194,989 A | 3/1993 | Ferrante | 359/583 |
| 5,225,926 A | 7/1993 | Cuomo | 359/350 |
| 5,248,545 A | 9/1993 | Proscia | 428/212 |
| 5,296,302 A | 3/1994 | O'Shaughnessy | 428/472 |
| 5,302,449 A | 4/1994 | Eby | 428/336 |

(Continued)

FOREIGN PATENT DOCUMENTS

DE    10206787    2/2003

(Continued)

OTHER PUBLICATIONS

Compact Oxford Dictionary (http://www.askoxford.com/concise_oed/sheet_1?view=uk).*

(Continued)

*Primary Examiner*—Timothy M Speer
*Assistant Examiner*—Lauren Robinson
(74) *Attorney, Agent, or Firm*—Fredrikson & Byron, P.A.

(57) ABSTRACT

A substrate bearing a low-emissivity coating, the coating comprising two infrared-reflective layers separated by a middle coat, the middle coat comprising two zinc tin oxide film regions separated by a tin oxide film region.

8 Claims, 5 Drawing Sheets

U.S. PATENT DOCUMENTS

| | | | |
|---|---|---|---|
| 5,337,191 A | 8/1994 | Austin | 359/885 |
| 5,389,445 A | 2/1995 | Makowiecki | 428/457 |
| 5,413,864 A * | 5/1995 | Miyazaki et al. | 428/432 |
| 5,419,969 A | 5/1995 | Miyazaki | 428/426 |
| 5,438,235 A | 8/1995 | Sommerer | |
| 5,502,595 A | 3/1996 | Kuo | 359/589 |
| 5,506,037 A | 4/1996 | Termath | 428/216 |
| 5,532,062 A | 7/1996 | Miyazaki | 428/432 |
| 5,543,229 A | 8/1996 | Ohsaki | 428/432 |
| 5,712,724 A | 1/1998 | Klocek | 359/350 |
| 5,821,001 A | 10/1998 | Arbab | 428/623 |
| 5,834,103 A | 11/1998 | Bond | 428/216 |
| 5,837,361 A | 11/1998 | Glaser | 428/336 |
| 5,930,046 A | 7/1999 | Solberg | 359/580 |
| 5,942,338 A | 8/1999 | Arbab | 428/623 |
| 5,948,538 A | 9/1999 | Brochot | 428/432 |
| 5,962,115 A | 10/1999 | Zmelty | 428/216 |
| 6,030,671 A | 2/2000 | Yang | |
| 6,042,934 A | 3/2000 | Guiselin | 359/360 |
| 6,045,896 A | 4/2000 | Boire | 428/216 |
| 6,060,178 A | 5/2000 | Krisko | 428/627 |
| 6,090,481 A | 7/2000 | Depauw | 428/336 |
| 6,316,110 B1 | 11/2001 | Anzaki | 428/432 |
| 6,316,111 B1 | 11/2001 | Krisko | 428/434 |
| 6,524,688 B1 | 2/2003 | Eby | 428/216 |
| 7,192,647 B2 | 3/2007 | Hartig | |
| 2002/0102352 A1* | 8/2002 | Hartig et al. | 427/165 |
| 2003/0180547 A1 | 9/2003 | Buhay | 428/208 |

FOREIGN PATENT DOCUMENTS

| | | |
|---|---|---|
| EP | 0260751 | 3/1988 |
| EP | 0 847 965 A1 | 6/1998 |
| EP | 1 010 677 A1 | 6/2000 |
| EP | 1010677 | 6/2000 |
| EP | 1 044 934 | 10/2000 |
| EP | 0847965 | 8/2006 |
| FR | 2535650 | 11/1984 |
| FR | 2746791 | 10/1997 |
| GB | 2199360 | 7/1988 |
| JP | 1157881 | 6/1999 |
| JP | 11157881 | 8/2006 |
| WO | WO 97/48649 | 12/1997 |
| WO | WO 99/58736 | 11/1999 |
| WO | WO 01/44131 | 6/2001 |
| WO | 2005092812 | 10/2005 |
| WO | 2006048463 | 5/2006 |

OTHER PUBLICATIONS

Merriam-Webster (http://www.merriam-webster.com/dictionary/plate).*

* cited by examiner

HAZE-RESISTANT LOW-EMISSIVITY COATINGS

CROSS-REFERENCE TO RELATED APPLICATIONS

The present application claims priority to U.S. Application No. 60/666,799, filed Mar. 31, 2005, the disclosure of which is incorporated herein by reference.

FIELD OF THE INVENTION

The present invention relates to transparent film stacks of the type commonly applied to window glazings or the like and has particular utility in connection with low emissivity coatings.

BACKGROUND OF THE INVENTION

Low emissivity coatings are well known in the art. Typically, they include one or more layers of an infrared-reflective film and one or more layers of dielectric material. The infrared-reflective films, which typically are conductive metals such as silver, gold or copper, help reduce transmission of heat through the coating. The dielectric materials are used, for example, to reduce visible reflectance and to control other properties of the coatings, such as color and visible transmittance. Commonly used dielectric materials include oxides of zinc, tin, indium, bismuth, and titanium.

U.S. Pat. No. 4,859,532, issued to Oyama, et al. describes one simple low-emissivity coating. The patent describes a five-layered transparent coating having a zinc oxide layer formed directly on the substrate, which is typically a sheet of float glass or the like. A second silver layer is formed on the zinc oxide layer. A third zinc oxide layer is formed on the second silver layer. A fourth silver layer is formed on the third zinc oxide layer. Finally, a fifth zinc oxide layer is formed on the fourth silver layer. The thickness of the first and fifth zinc oxide layers is said to be 200-600 angstroms while the thickness of the third, middle zinc oxide layer is said to be 400-1200 angstroms. Both of the silver layers are 60-250 angstroms thick, with a range of 80-100 angstroms being said to be preferred. In coatings of this nature wherein the whole dielectric film region between the two silver layers is formed by a single zinc oxide layer, film defects may be more likely to extend through the entire thickness of this middle dielectric region.

It is often necessary to heat glass sheets to temperatures at or near the melting point of the glass to temper the glass or to enable the glass to be bent into desired shapes such as motor vehicle windshields. Coated glass articles often must be able to withstand high temperatures for periods of time up to several hours. Tempering, as is known, is particularly important for glass intended for use as automobile windows and particularly for use as automobile windshields. Upon breaking, tempered windshields desirably exhibit a break pattern in which they shatter into a great many small pieces rather than into large, dangerous sharp shards. Tempering temperatures on the order of 600° C. and above are required. Film stacks employing silver as an infrared-reflective film often cannot withstand such temperatures without some deterioration of the silver film. To avoid this problem, glass sheets can be heated and bent or tempered before they are coated, and later can be provided with the desired metal and metal oxide coatings. Particularly for bent glass articles, though, this procedure may produce non-uniform coatings and is costly.

One further problem encountered during tempering is the development of a haze within the film stack. It appears that this hazing is associated with the growth of crystals within the layers. When layers are initially deposited (e.g., via magnetron sputtering), they tend to have either a fairly amorphous microstructure or a rather small grain size. At the elevated temperatures associated with tempering, the crystals in these layers are believed to grow larger until they become large enough to have a direct effect on the light passing therethrough. This, it is surmised, causes haze in the coating when it is treated at elevated temperatures.

If the 5-layer Oyama et al. film stack were tempered at elevated temperatures, it is rather likely that the silver layers would be oxidized sufficiently to render the resulting coated glass article unsellable. Even if the film stack were modified to protect the silver layers, the tempering likely would reduce transmittance of the coating due to the development of a haze in the dielectric ZnO layers. The impact of this haze on the quality of the glass coating would depend on the tempering profile—longer times at elevated temperatures will further increase the hazing problem while shorter, cooler cycles will minimize (though not eliminate) the hazing problem.

The above description pertains primarily to efforts to produce glass structures useful as architectural glass or glass for automobile windows, in which the glass structures in use are not usually subjected to high temperatures after they have once been tempered or bent. Coated glass sheets may also find utility as windows for ovens of various types in which the windows are subjected to repeated heating and cooling cycles as the ovens are heated and cooled during normal usage. A good example of such usage is a self-cleaning kitchen oven in which the oven temperature may be repeatedly raised to cooking temperatures of 250° F. to 450° F. with frequent excursions to, e.g., 900° F. during cleaning cycles. An oven window of this type should be transparent to enable one to see through it into the oven. It should be highly reflective in the infrared range to retard heat loss from the oven and help keep the exterior of the oven from getting too hot. Further, it must be resistant to deterioration resulting from repeated temperature escalations while exposed to the conditions of humidity and chemical (food) oven conditions.

SUMMARY OF THE INVENTION

In some embodiments, the invention provides a sheet-like substrate having first and second general-opposed major surfaces, at least one of the major surfaces bearing a low-emissivity coating. The coating comprises, in sequence, from the substrate outwardly: a) an inner dielectric layer; b) a first infrared-reflective layer; c) a middle coat comprising a first zinc tin oxide film region, a tin oxide film region, and a second zinc tin oxide film region, wherein said tin oxide film region is positioned between said first and second zinc tin oxide film regions; d) a second infrared-reflective layer; and e) an outer dielectric layer.

The tin oxide film region preferably has a thickness of less than 100 angstroms, more preferably between about 5 angstroms and about 80 angstroms, and optimally between about 30 angstroms and about 70 angstroms. The first and second zinc tin oxide film regions preferably have a combined thickness of at least about 300 angstroms. The first and second zinc tin oxide film regions are also preferably each sputter deposited from one or more targets each comprising sputterable material containing between about 11% and about 16% tin by weight with the remainder being zinc. The second infrared-reflective layer is also preferably positioned directly over the second zinc tin oxide film region. A blocker layer can also be disposed between the first infrared-reflective layer and the middle coat. Also, all the film regions of the middle coat can contain at least some tin oxide in some embodiments.

In other embodiments, the invention provides a sheet-like substrate having first and second generally-opposed major surfaces, at least one of the major surfaces bearing a low-emissivity coating, the coating comprising two infrared-reflective silver-containing layers separated by a middle coat, the middle coat comprising two zinc tin oxide film regions separated by a tin oxide film region, the tin oxide film region having a thickness of less than 100 angstroms. The tin oxide film region preferably has a thickness of between about 30 angstroms and about 70 angstroms.

In other embodiments, the invention provides a method of producing a coated glass article, the method comprising: a) providing a glass sheet; b) forming a coating on a major surface of the glass substrate by depositing the following film regions in sequence from the major surface outwardly: i) an inner dielectric layer; ii) a first infrared-reflective layer; iii) a middle coat comprising a first zinc tin oxide film region, a tin oxide film region, and a second zinc tin oxide film region; iv) a second infrared-reflective layer; and v) an outer dielectric layer. The tin oxide film region is preferably deposited at a thickness of less than 100 angstroms, more preferably deposited at a thickness of between about 5 angstroms and about 80 angstroms, and optimally deposited at a thickness of between about 30 angstroms and about 70 angstroms. The first and second zinc and tin oxide film regions are also preferably deposited at a combined thickness of at least about 300 angstroms. The first and second zinc tin oxide film regions are preferably each sputter deposited from one or more targets each comprising sputterable target material containing between about 11% and about 16% tin by weight with the remainder being zinc. Additionally, the second infrared-reflective film region is preferably deposited directly over the second zinc tin oxide film region. A blocker layer is also preferably deposited between the first infrared-reflective film region and the middle coat. Also, all of the film regions of the middle coat can contain at least some tin oxide in some embodiments.

DETAILED DESCRIPTION OF THE PREFERRED EMBODIMENTS

Figure 1:
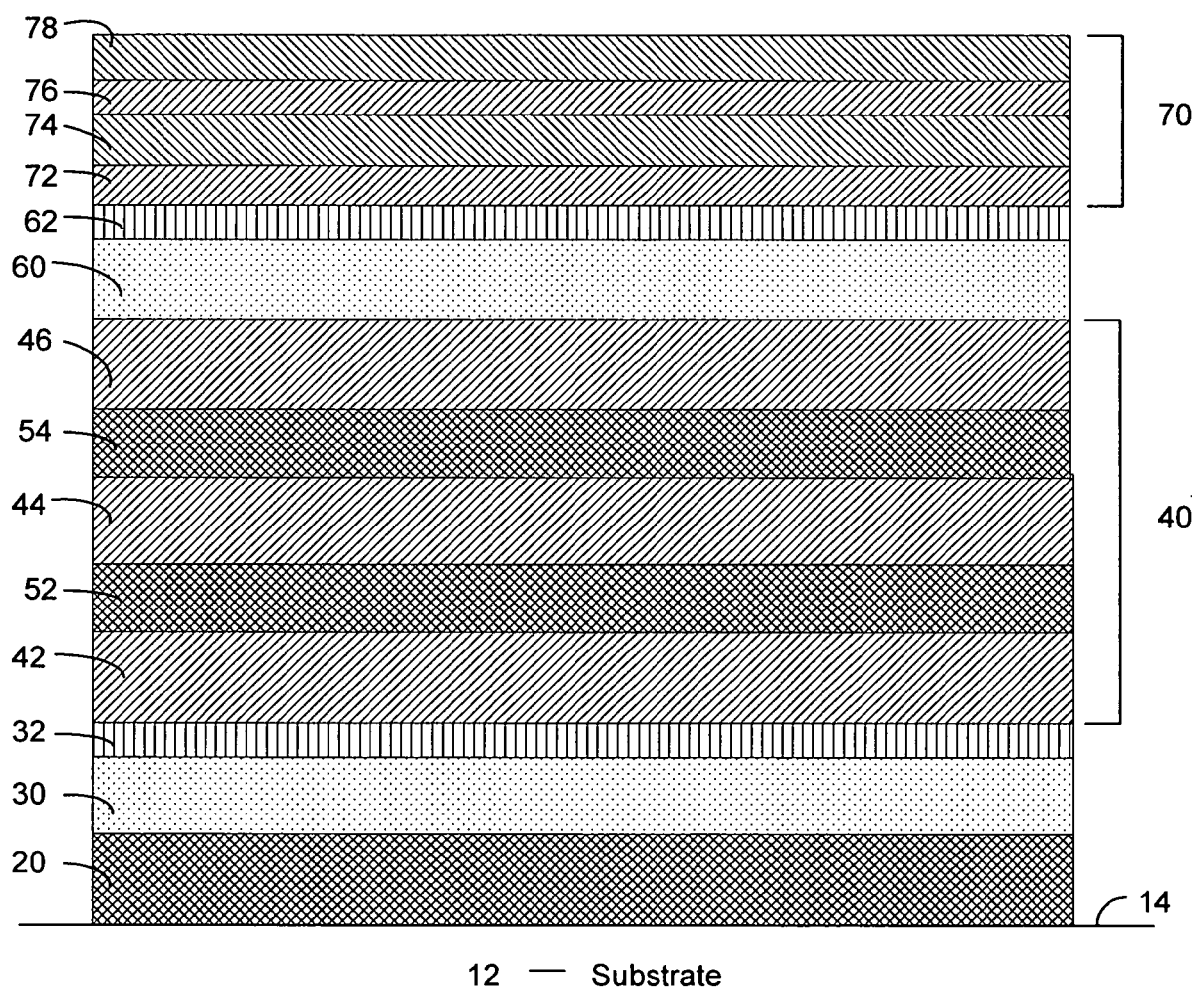
FIG. 1 is a schematic cross-sectional view of one embodiment of a film stack in accordance with the invention.

The following detailed description is to be read with reference to the drawings, in which like elements in different drawings have been given like reference numerals. The drawings, which are not necessarily to scale, depict selected embodiments and are not intended to limit the scope of the invention. Skilled artisans will recognize that the examples given have many useful alternatives that fall within the scope of the invention.

FIG. 1 schematically illustrates a substrate 12 bearing a coating in accordance with one embodiment of the invention.

It should be understood that this drawing is intended merely to illustrate concepts of the invention and the thicknesses of the various layers in the drawing are not to scale. The substrate 12 in this drawing comprises a coating of the invention applied to a surface 14. While opaque substrates may be used, it is anticipated that for most applications of this invention, the substrate 12 will comprise a transparent or translucent material such as glass or a clear plastic. The substrate is preferably a sheet-like substrate. While the substrate could take any form, one particularly suitable application for the invention is in windows, such as those used in architectural applications, automobile windshields, and oven doors, to name but a few examples.

An inner dielectric layer 20 is applied on the surface 14 of the substrate 12. This inner dielectric layer may be of any desired composition. As described in U.S. Pat. No. 5,296,302 (the teachings of which are incorporated herein by reference), suitable dielectric layers for this purpose include oxides of zinc, tin, indium, bismuth, titanium, hafnium, zirconium, and alloys thereof. While oxides are generally preferred due to their ease and low cost of application, other dielectric materials such as metal nitrides could be used if desired.

The inner dielectric layer 20 may comprise a single layer of a single dielectric material, as shown. If such a single layer is used, it is generally preferred that this inner dielectric layer be formed of an oxide of zinc or an alloy or mixture thereof, such as a mixture of zinc oxide and bismuth oxide or tin oxide. It should be understood, though, that the single layer 20 shown in FIG. 1 may be replaced with two or more layers of different dielectric materials. While the exact composition of this inner dielectric layer is beyond the scope of the present invention, it is generally preferred that at least a thin layer of zinc oxide be applied as an outermost layer (i.e., the layer farthest away from the substrate 12 and immediately adjacent the first infrared-reflective layer 30) as this is believed to enhance the optical properties of the film stack, at least if silver is used as the layer 30. In some preferred embodiments, the inner dielectric layer 20 is the only layer between the substrate and the first infrared-reflective layer 30, and the inner layer consists essentially of a zinc tin oxide layer, optionally having a thickness of less than about 190 angstroms, perhaps preferably less than about 170 angstroms, and perhaps optimally less than about 140 angstroms.

The next layer in the coating of FIG. 1 is the first infrared-reflective layer 30. This first infrared-reflective layer is contiguous to, i.e., in direct physical contact with, the inner dielectric layer 20. Any suitable infrared-reflective material can be used for this layer. Silver, gold and copper, as well as alloys thereof, are the most commonly used infrared-reflective layers. It is preferred that the infrared-reflective layer 30 be formed of silver or silver combined with no more than about 5% gold, palladium or platinum. The infrared-reflective layer can also be formed of silver combined with no more than about 5% nickel, preferably no more than about 2% nickel, and perhaps optimally no more than about 0.2% nickel.

In order to protect the infrared-reflective layer during application of subsequent layers and during any tempering operation, a first sacrificial layer 32 is desirably applied over and contiguous to the first reflective layer 30. The primary purpose of this sacrificial layer 32 is to protect the underlying infrared-reflective layer 30 from chemical attack. Any material which is more readily oxidized than is the infrared-reflective layer may be used as such a sacrificial layer. In most commercial applications, a thin layer of titanium metal is applied, with the majority of that titanium metal being converted to a titanium oxide of varying stoichiometry during deposition of subsequent layers of the coating. In one particularly preferred embodiment, though, the sacrificial layer 32 comprises a layer of niobium deposited at a thickness sufficient to protect the infrared-reflective layer 30 from degradation both during sputtering of subsequent layers and from degradation during high temperature applications or tempering. Suitable thicknesses for such niobium layers range from 7-25 angstroms, with a range of about 12-18 angstroms being preferred. While this is not illustrated in FIG. 1, such a niobium sacrificial layer may also be provided under the infrared-reflective layer 30. Barrier layers of niobium used in transparent film stacks are discussed in some detail in PCT International Publication No. WO 97/48649, the teachings of which are incorporated herein by reference.

The intermediate dielectric stack (or "middle coat") 40 is positioned between the first infrared-reflective layer 30 and a second infrared-reflective layer 60. This intermediate dielectric stack is formed of a plurality of intermediate/dielectric layers. While the number of intermediate dielectric layers can be varied as desired, it is preferred that there be three such layers in the intermediate dielectric stack. While any suitable number of layers may be used in this intermediate dielectric stack 40, in one embodiment which has been found to work well, there are only three intermediate dielectric layers, with the bottom and top layers of this stack 40 both comprising zinc tin oxide, wherein a tin oxide layer is sandwiched between the two noted zinc tin oxide layers of the middle coat.

In one specific embodiment of the invention, the intermediate dielectric stack comprises alternating layers of a first dielectric (e.g., zinc tin oxide) and a second dielectric (e.g., tin oxide). In the configuration shown in FIG. 1, the intermediate dielectric stack 40 includes a first intermediate layer 42, third intermediate layer 44 and fifth intermediate layer 46 each formed of a first dielectric material, and a second intermediate layer 52 and fourth intermediate layer 54 each formed of a second dielectric material. While additional layers of any other material (e.g., a relatively thin layer of silica) can be included at any point deemed appropriate within the first stack 40, it is preferred that each of the illustrated layers be applied contiguous to at least one other layer of the intermediate dielectric stack 40. Hence, in the embodiment shown in FIG. 1, the second intermediate layer 52 preferably is contiguous to both the first intermediate layer 42 and the third intermediate layer 44. Similarly, the fourth intermediate layer 54 preferably is contiguous to the third intermediate layer 44 and the fifth intermediate layer 46.

For reasons discussed below, it is preferred that each layer of the intermediate stack have a different microstructure from each dielectric layer contiguous thereto, preferably by forming contiguous layers of different materials. When provided, the first, third and fifth intermediate layers (42, 44 and 46, respectively) can optionally be formed of the same material, such as zinc tin oxide. Similarly, the second and fourth intermediate layers (52 and 54, respectively) are desirably formed of the same dielectric material, such as tin oxide.

Care should be taken to ensure that none of the layers of the intermediate dielectric stack 40 are too thick. Preferably, each of these layers is kept relatively thin. It is preferred that the thickness of each of these layers be maintained well beneath one-quarter of the wavelength of the light of primary interest. If the substrate is used as a window, for example, maximizing transmission of visible light and reducing visible haze is paramount. As visible light is generally considered to be 3,000-7,000 angstroms in wavelength, each of the layers can optionally be less than about 700 angstroms in optical thickness. (Optical thickness, which is a measure of the optical effect of a thin film on light transmitted therethrough, is the product of the physical thickness of the layer and the index of refraction of the material comprising the layer. For example, a 200 angstroms layer of zinc tin oxide having an index of refraction of about 2.0 will have an optical thickness of about 400 angstroms.) In the present coatings, it is believed that a maximum physical thickness of about 350 angstroms is desirable, with a maximum physical thickness of no more than about 300 angstroms being preferred.

If crystals in thin films become too large, it is believed that they will scatter light passing therethrough even if they are not so large as to exceed a quarter of the wavelength of the light. Accordingly, to minimize the likelihood of such destructive and unattractive scattering, each of the intermediate dielectric layers of the intermediate dielectric stack 40 desirably have an optical thickness of no more than about 700 angstroms, with a maximum physical thickness of about 350 angstroms being preferred and a maximum physical thickness of about 300 angstroms being particularly preferred. While each layer is desirably no thicker than this maximum, all of the layers need not have the same thickness.

In its simplest form, the invention merely requires that the intermediate dielectric stack be formed of a plurality of intermediate dielectric layers comprising a tin oxide film region between two film regions comprising zinc tin oxide. In one particular version of this invention, noted above, the intermediate dielectric stack is formed of alternating layers of a first dielectric (e.g., zinc tin oxide) and a second dielectric (e.g. tin oxide). It is particularly preferred that the first and second dielectrics of this embodiment have an index of refraction which is relatively close. As these dielectrics desirably comprise different materials, it is unlikely that the indices of refraction will be identical. Nonetheless, in a film stack according to this preferred embodiment, care should be taken to select dielectric materials which have indices of refraction relatively close to one another. Preferably, the index of refraction of these two materials should be within 10% of one another. Stated another way, the index of refraction of one of the two dielectrics should be between about 90% and 110% of the index of refraction of the other dielectric material.

Pure zinc oxide is a polycrystalline material when applied in thin films via magnetron sputtering. Treating zinc oxide films at high temperatures, such as in tempering operations, tends to promote relatively rapid crystal growth. If a coating has zinc oxide layers that are too thick, this can contribute significantly to haze.

FIG. 1 illustrates a "double-silver" film stack which includes a second infrared-reflective layer 60 carried atop the intermediate dielectric stack 40. As noted above, a sacrificial layer of niobium or any other suitable nucleation layer can be disposed between the intermediate dielectric stack 40 and the infrared-reflective layer 60. If so desired, the outermost dielectric layer of the intermediate dielectric stack can be formed of an oxide sputtered from a target consisting essentially of zinc and tin.

The materials useful in forming the first infrared-reflective layer 30 are also useful in forming the second infrared-reflective layer 60. It is anticipated that both of these layers will be formed of the same material. Preferably, both layers comprise silver, with the second, outer layer 60 being somewhat thicker than the inner layer 30. Similarly, a second sacrificial layer 62 of niobium or the like can be applied over the second infrared-reflective layer 60 to help protect the second infrared-reflective layer from oxiding or nitriding during subsequent processing or use.

An outer dielectric layer desirably is applied over the outer infrared-reflective layer 60. The exact nature of this outer dielectric layer can be varied as desired. Any of a wide variety of single layers or film stacks known in the art can be used as the outermost layer or layers of the film stack. Optionally, none of the layers of this outer film stack have a physical thickness of more than about 225 angstroms or an optical thickness of more than about 450 angstroms.

In the illustrated embodiment, an outer dielectric stack 70 is applied over the sacrificial layer 62. This outer stack 70 may comprise, for example, zinc oxide or zinc tin oxide applied at about 60-70 angstroms. A layer of titanium nitride 76 can optionally be sandwiched between layers of silicon nitride 74, 78 and this sandwich is applied directly over a zinc oxide layer 72. In one exemplary embodiment, the innermost of these silicon nitride layers 74 is on the order of 20-50 angstroms thick, the tin oxide layer 76 is about 12-15 angstroms and the outermost silicon nitride layer 78 is 150-180 angstroms.

As noted above, the present invention also contemplates a method of producing a coated substrate, e.g., a coated glass article. In accordance with this method, a substrate 12 having a surface 14 is provided. If so desired, this substrate surface 14 may be prepared by suitable washing or chemical preparation.

The low-emissivity coating can optionally be deposited on the surface 14 of the substrate 12 as a series of discrete layers. These layers can be deposited in any desired fashion. In many cases, the layers will be deposited using a sputtering method, such as DC, AC and/or pulsed DC sputtering. One preferred method of depositing these layers utilizes DC magnetron sputtering, which is commonly used in the industry and one embodiment of which is described in Chapin's U.S. Pat. No. 4,166,018, the teachings of which are incorporated herein by reference. Briefly, though, magnetron sputtering deposition involves transporting a substrate through a series of low pressure zones in which the various films that make up the film stack are sequentially applied. Metallic films are sputtered from metallic sources or "targets," typically in an inert atmosphere such as argon. To deposit a dielectric film, the target may be formed of the desired dielectric itself (e.g., zinc oxide, titanium dioxide, or sub-oxides thereof. More commonly, though, the dielectric layers are applied by sputtering a metal target in a reactive atmosphere. To deposit zinc oxide, for example, a zinc target will be sputtered in an oxidizing atmosphere; silicon nitride may be deposited by sputtering a silicon target (which may be doped with aluminum or the like to improve conductivity) in a reactive atmosphere containing nitrogen gas. The thickness of the films that are thus deposited may be controlled by varying the speed of the glass substrate through the coating compartments and by varying the power and sputtering rate of each individual target.

In certain embodiments, the invention provides a low-emissivity coating having a middle coat comprising first and second film regions of zinc tin oxide separated by a film region of tin oxide. Preferably, the first and second film regions of zinc tin oxide have a combined thickness of at least about 300 angstroms. Also, the film region of tin oxide preferably has a thickness of less than 100 angstroms, more preferably between about 5 angstroms and about 80 angstroms, and optimally between about 30 angstroms and 70 angstroms (e.g., about 40-60 angstroms). In some embodiments, the low-emissivity film stack includes the noted middle coat and first and second silver-containing infrared-reflective layers, wherein the second (i.e., outer) infrared-reflective layer is positioned directly on top of the second zinc tin oxide film region.

In certain embodiments, the first zinc tin oxide film region comprises a discrete (e.g., homogenous) layer of zinc tin oxide, the second zinc tin oxide film region comprises a discrete (e.g., homogenous layer of zinc tin oxide, the tin oxide region comprises a discrete (e.g., homogenous) layer of tin oxide. An embodiment of this nature is illustrated in FIG. 2.

Figure 2:
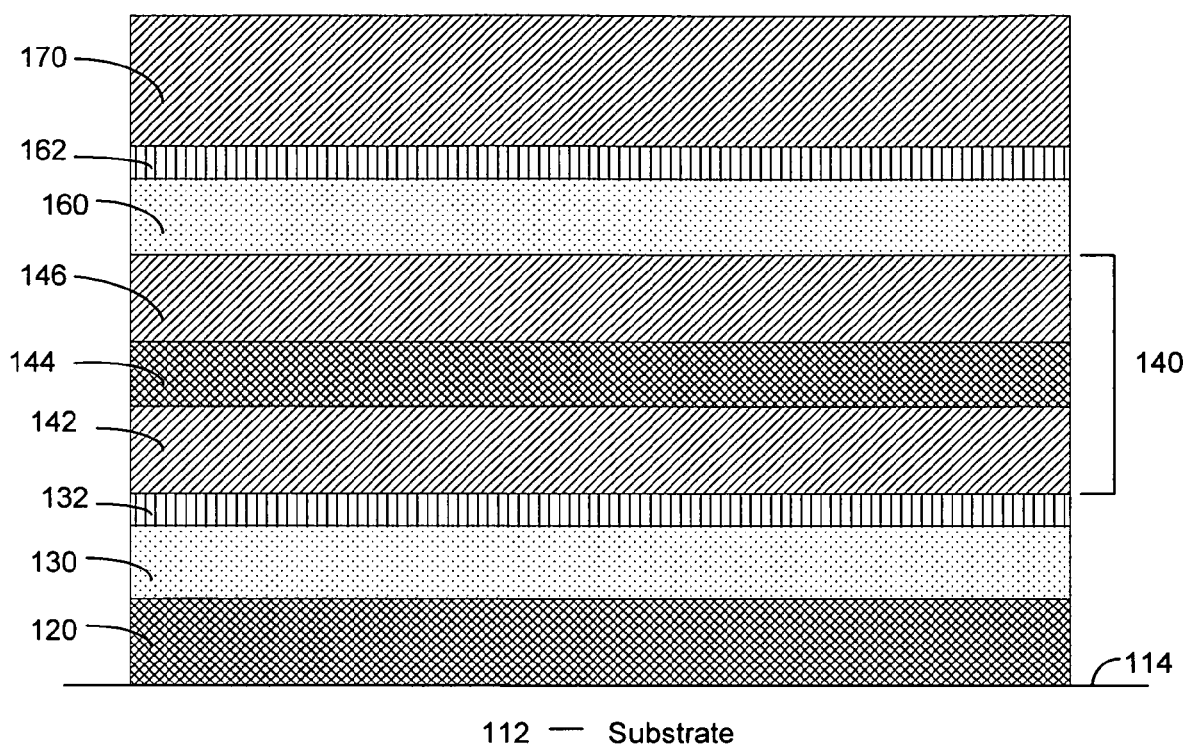
FIG. 2 is a schematic cross-sectional view of another embodiment of a film stack in accordance with the invention.

FIG. 2 schematically illustrates a substrate 112 bearing a low-emissivity coating including a middle coat 140 including a first film region comprising zinc tin oxide 142 and a second film region comprising zinc tin oxide 146, these two regions 142, 146 being separated by a middle film region comprising tin oxide 144. An inner dielectric layer 120 is applied on the surface 114 of the substrate 112. Materials useful for forming the inner dielectric layer are described above. The next layer in the coating of FIG. 2 is the first infrared-reflective layer 130. Materials useful for forming the infrared-reflective layers have been described. In order to protect the first infrared-reflective layer 130 during application of subsequent layers and during any tempering operation, a first sacrificial layer 132 is desirably applied over and contiguous to the first infrared-reflective layer 130. Materials useful for forming the sacrificial layer are described above.

The middle coat 140 is positioned between the first infrared-reflective layer 130 and a second infrared-reflective layer 160. The middle coat 140 includes a film region of tin oxide 144 between two zinc tin oxide film regions (i.e., a first film region of zinc tin oxide 142 and a second film region of zinc tin oxide 146). The first film region 142 and the second film region 146 preferably have a combined thickness of at least about 300 angstroms. The film region 144 preferably includes or consists essentially of tin oxide. The film region 144 preferably has a thickness of less than 100 angstroms, more preferably between about 5 angstroms and about 80 angstroms, and perhaps optimally between about 30 angstroms and about 70 angstroms.

The next layer of FIG. 2 is the second infrared-reflective layer 160. Again, materials useful for forming the infrared-reflective layers have been described. In order to protect the infrared-reflective layer 160 during application of subsequent layers and during any tempering operation, a second sacrificial layer 162 is desirably applied over and contiguous to the second infrared-reflective layer 160. Materials useful for forming the sacrificial layer have already been described. An outer layer 170 may optionally be provided over the second infrared-reflective layer 160 (and in some cases, over the second sacrificial layer 162). As noted above, the outer layer 170 may be a single layer or a film stack including more than one layer. In certain embodiments, one or more nucleation layers can be positioned underneath each infrared-reflective layer. Such a nucleation layer serves as a good foundation for the infrared-reflective layer. The layer can include nickel-chrome, nickel-titanium, chromium, tungsten, tantalum or mixtures thereof.

In some embodiments of the middle coat, the first zinc tin oxide film region comprises a graded film region having a substantially continuously increasing (as measured moving further and further away from the substrate) concentration of tin oxide, while the second zinc tin oxide film region comprises a graded film region having a substantially continuously decreasing concentration of tin oxide. Optionally, there is at least some thickness of pure or substantially pure tin oxide between the two graded film regions.

Figure 3:
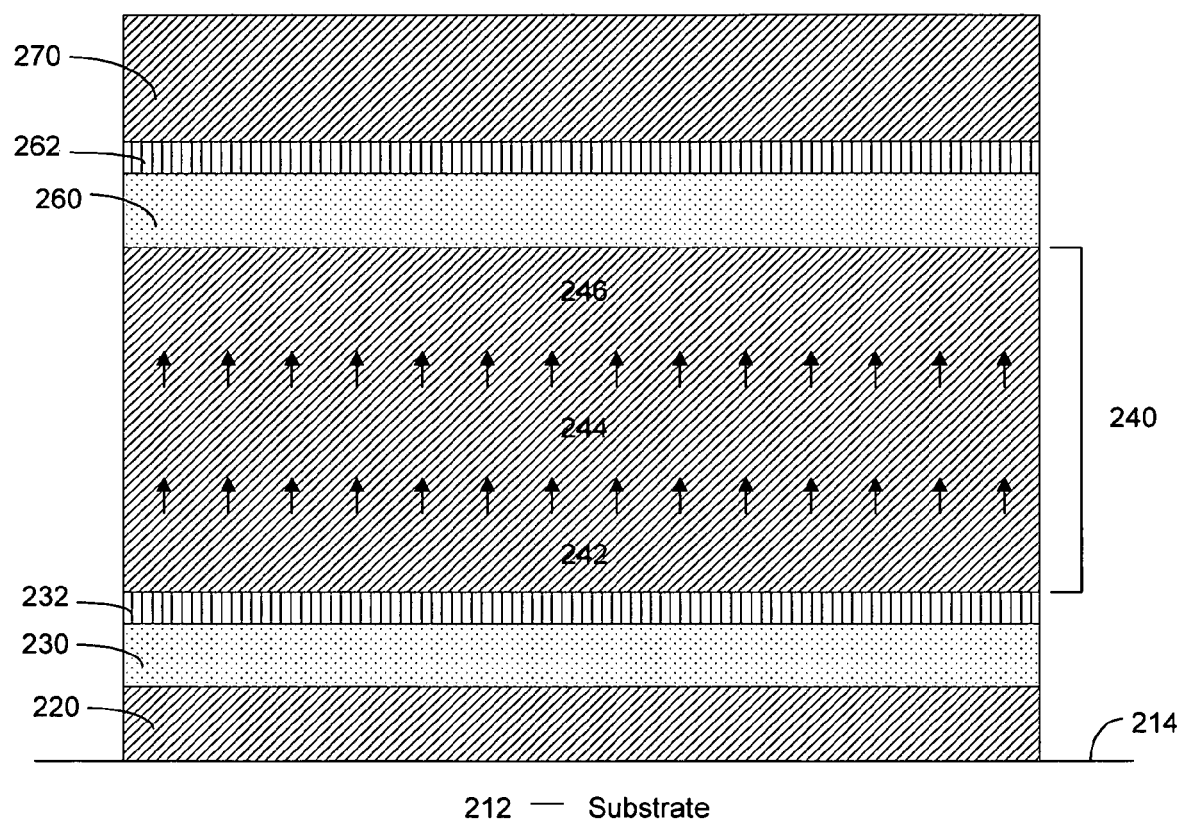
FIG. 3 is a schematic cross-sectional view of yet another embodiment of a film stack in accordance with the invention.

FIG. 3 schematically illustrates a substrate 212 bearing a low-emissivity coating including a middle coat 240 including a first film region comprising zinc tin oxide 242 and a second film region comprising zinc tin oxide 246, the two zinc tin oxide regions 242, 246 being separated by a middle film region comprising tin oxide 244. Here, an inner dielectric layer 220 is applied on the surface 214 of the substrate 212.

The next layer in the coating of FIG. 3 is the first infrared-reflective layer 230. In order to protect the infrared-reflective layer during application of subsequent layers and during any tempering operation, a first sacrificial layer 232 is desirably applied over and contiguous to the first infrared-reflective layer 230.

The middle coat 240 is positioned between the first infrared-reflective layer 230 and a second infrared-reflective layer 260. The middle coat 240 includes a first zinc tin oxide graded film region 242 having a substantially continuously increasing concentration of tin oxide and a second zinc tin oxide graded film region 246 having a substantially continuously decreasing concentration of tin oxide. The first graded film region 242 and the second graded film region 246 preferably have a combined thickness of at least 300 angstroms. Preferably there is at least some thickness of substantially pure or essentially pure tin oxide between film regions 242 and 246. The middle film region 244 preferably has a thickness of less than 100 angstroms, more preferably between about 5 angstroms and about 80 angstroms, and optimally between about 30 angstroms and about 70 angstroms.

The next layer of FIG. 3 is the second infrared-reflective layer 260. In order to protect the infrared-reflective layer during application of subsequent layers and during any tempering operation, a second sacrificial layer 262 is desirably applied over and contiguous to the second infrared-reflective layer 260. An outer layer 270 may optionally be provided over the second infrared-reflective layer 260 (and in some cases, over the second sacrificial layer 262). As noted above, the outer layer 270 may be a single layer or a film stack including more than one layer.

Figure 4:
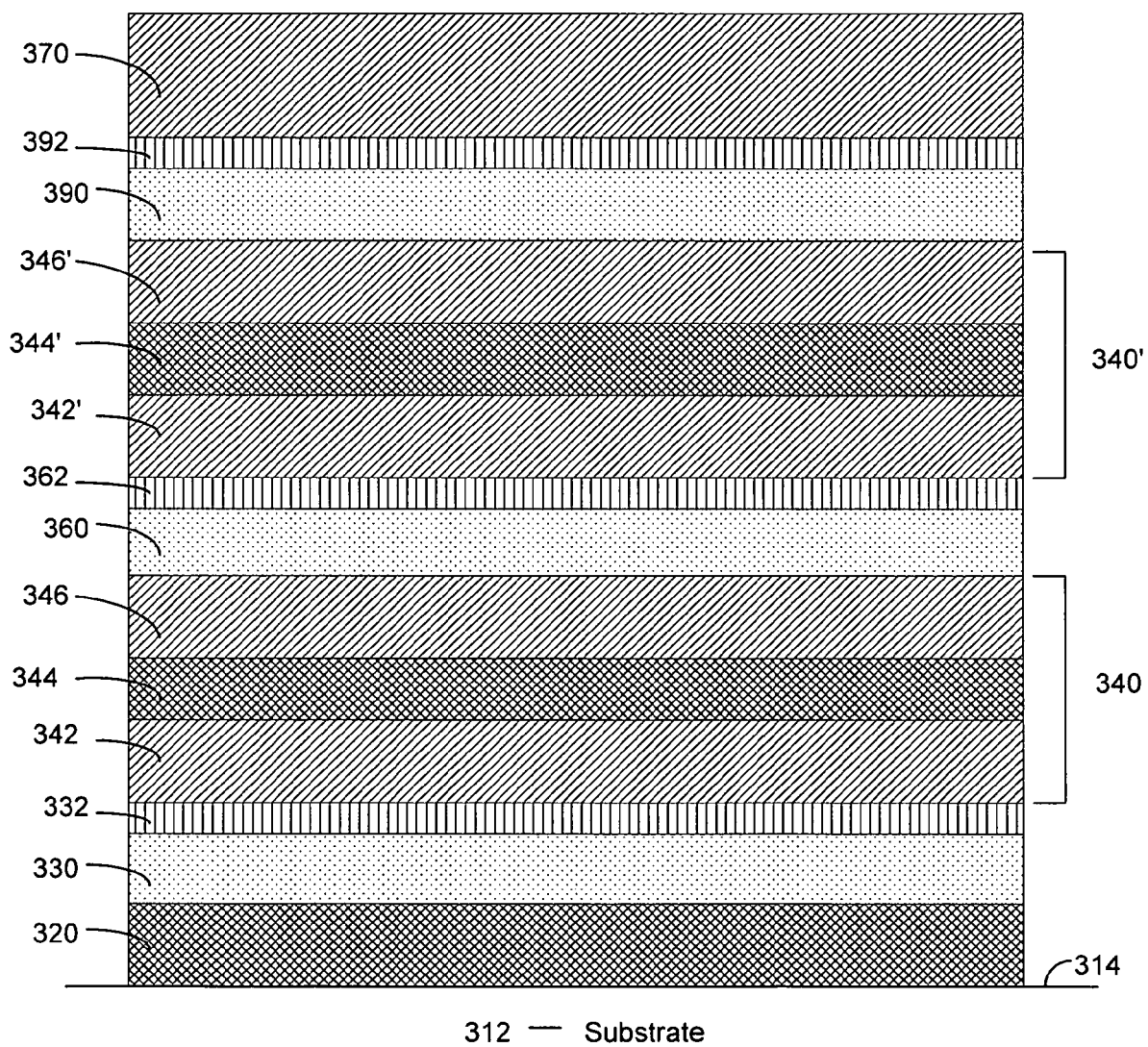
FIG. 4 is a schematic cross-sectional view of yet another embodiment of a film stack in accordance with the invention.

FIG. 4 schematically illustrates a substrate 312 bearing a low-emissivity coating including three infrared-reflective layers and two middle coats. 340 and 340'. An inner dielectric layer 320 is applied on the surface 314 of the substrate 312. Materials useful for forming the inner dielectric layer are described above. The next layer is the first infrared-reflective layer 330. Materials useful for forming the infrared-reflective layers have been described. A first sacrificial layer 332 is desirably applied over and contiguous to the first infrared-reflective layer 330. Materials useful for forming the sacrificial layer are described above.

A first middle coat 340 is positioned between the first infrared-reflective layer 330 and a second infrared-reflective layer 360. The first middle coat 340 includes a film region of tin oxide 344 between two zinc tin oxide film regions (i.e., a first film region of zinc tin oxide 342 and a second film region of zinc tin oxide 346). The first film region 342 and the second film region 346 preferably have a combined thickness of at least about 300 angstroms. The film region 344 preferably includes or consists essentially of tin oxide. The film region 344 preferably has a thickness of less than 100 angstroms, more preferably between about 5 angstroms and about 80 angstroms, and perhaps optimally between about 30 angstroms and about 70 angstroms. A second sacrificial layer 362 is desirably applied over and contiguous to the second infrared-reflective layer 330.

A second middle coat 340' is positioned between the second infrared-reflective layer 360 and a third infrared-reflective layer 390. The second middle coat also includes a film region of tin oxide 344' between two zinc tin oxide film regions (i.e., a first film region of zinc tin oxide 342' and a second film region of zinc tin oxide 346'). These film regions preferably have substantially the same thickness as already described for the film regions of the first middle coat 340. A third sacrificial layer 392 is desirably applied over and contiguous to the third infrared-reflective layer 390. An outer layer 370 may optionally be provided over the third infrared-reflective layer 390 (and in some cases, over the third sacrificial layer 392). As noted above, the outer layer 370 may be a single layer or a film stack including more than one layer.

The invention also provides methods for depositing a coating containing a middle coat comprising a tin oxide film region sandwiched between (e.g., directly between) first and second zinc tin oxide film regions. Generally, a method of forming a coating is provided, comprising providing a glass substrate and forming a coating on a major surface of the glass substrate, the coating containing a middle coat comprising a tin oxide film region disposed between first and second zinc tin oxide film regions. In certain embodiments, the method comprises providing a glass substrate and depositing in sequence from the substrate outwardly: (i) an inner dielectric layer; (ii) a first infrared-reflective layer; (iii) a middle coat comprising a tin oxide film region positioned between first and second zinc tin oxide film regions; (iv) a second infrared-reflective layer and v) an outer dielectric layer.

Preferably, the middle coat is deposited by sputtering, (optionally by AC or DC magnetron sputtering), although other methods are within the scope of the invention. In certain embodiments, the first zinc tin oxide film and the second zinc tin oxide film regions are each formed by sputtering targets each containing zinc and tin. Preferably, the first zinc tin oxide film region and the second zinc tin oxide film region are each formed by sputtering targets each containing between about 11% and about 16% tin by weight with the remainder being zinc atoms.

In cases where the middle coat includes graded film regions, the first film region of zinc tin oxide is formed by depositing a substantially continuously increasing concentration of tin oxide, and the second film region of zinc tin oxide is formed by depositing a substantially continuously decreasing concentration of tin oxide. In other words, the middle coat can be deposited by arranging sputtering targets to produce a middle coat having the following structure: zinc tin oxide→tin oxide→zinc tin oxide, where each arrow represents a gradual (with increasing distance from the substrate) transition from one film composition to another.

Figure 5:
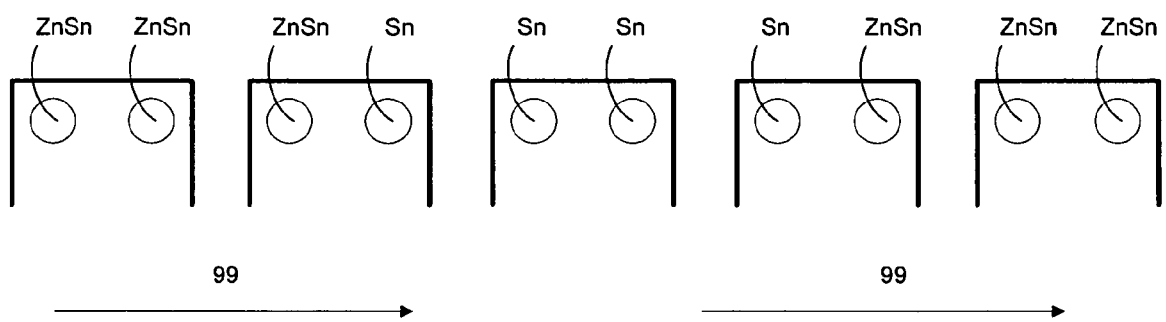
FIG. 5 is a view of an apparatus for depositing a film stack in accordance with the invention.

FIG. 5 depicts a sputtering apparatus that can be used to deposit a middle coat of the invention. Here, a substrate is conveyed through five sputtering bays, each optionally being provided with an oxidizing atmosphere. The substrate is conveyed through a first sputtering bay equipped with two targets each comprising zinc and tin. Next, the substrate is conveyed through a second sputtering bay in which the first target comprises zinc and tin and the second target comprises (e.g., consists essentially of) tin. Next, the substrate is conveyed through a third sputtering bay equipped with two targets each comprising (e.g., consisting essentially of) tin. The substrate is next conveyed through a fourth sputtering bay in which the first target comprises (e.g., consists essentially of) tin and the second target comprises zinc and tin. Next, the substrate is conveyed through a fifth sputtering bay equipped with two targets each comprising (e.g., consisting essentially of) zinc and tin.

While a preferred embodiment of the present invention has been described, it should be understood that various changes, adaptations and modifications may be made therein without departing from the spirit of the invention and the scope of the appended claims.

What is claimed is:

1. A sheet-like substrate having first and second generally-opposed major surfaces, at least one of the major surfaces bearing a low-emissivity coating, the coating comprising, in sequence, from the substrate outwardly:

a) an inner dielectric layer;
b) a first infrared-reflective layer;
c) a middle coat comprising a first zinc tin oxide film region, a tin oxide film region, and a second zinc tin oxide film region, wherein said tin oxide film region is positioned between said first and second zinc tin oxide film regions and has a thickness of between about 5 angstroms and about 80 angstroms, and wherein said first zinc tin oxide film region is a graded film region that includes a substantially continuously increasing concentration of tin oxide and said second zinc tin oxide film region is a graded film region that includes a substantially continuously decreasing concentration of tin oxide;
d) a second infrared-reflective layer; and
e) an outer dielectric layer.

2. The substrate of claim 1 wherein the tin oxide film region has a thickness of between about 30 angstroms and about 70 angstroms.

3. The substrate of claim 1 wherein the first and second zinc tin oxide film regions have a combined thickness of at least about 300 angstroms.

4. The substrate of claim 1 wherein the second infrared-reflective layer is positioned directly over the second zinc tin oxide film region.

5. The substrate of claim 1 comprising a blocker layer disposed between the first infrared-reflective layer and the middle coat.

6. A sheet-like substrate having first and second generally-opposed major surfaces, at least one of the major surfaces bearing a low-emissivity coating, the coating comprising two infrared-reflective silver-containing layers separated by a middle coat, the middle coat comprises a zinc tin oxide film region→tin oxide film region →zinc tin oxide film region structure, wherein said →represents a gradual transition from one film composition to another, the tin oxide film region having a thickness of between about 5 angstroms and about 80 angstroms.

7. The substrate of claim 6 wherein the tin oxide film region has a thickness of between about 30 angstroms and about 70 angstroms.

8. A sheet-like substrate having first and second generally-opposed major surfaces, at least one of the major surfaces bearing a low-emissivity coating, the coating comprising first, second and third infrared-reflective layers and one middle coat between the first and second infrared-reflective layers and another middle coat between the second and third infrared-reflective layers, each middle coat comprising a first zinc tin oxide film region, a tin oxide film region, and a second zinc tin oxide film region, the tin oxide film region having a thickness of between about 5 angstroms and about 80 angstroms, and wherein the first zinc tin oxide film region is a graded film region that includes a substantially continuously increasing concentration of tin oxide and the second zinc tin oxide film region is a graded film region that includes a substantially continuously decreasing concentration of tin oxide.

* * * * *

UNITED STATES PATENT AND TRADEMARK OFFICE
CERTIFICATE OF CORRECTION

PATENT NO. : 7,632,571 B2
APPLICATION NO. : 11/394992
DATED : December 15, 2009
INVENTOR(S) : Hartig et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 319 days.

Signed and Sealed this

Second Day of November, 2010

David J. Kappos
*Director of the United States Patent and Trademark Office*